US010164052B2

(12) United States Patent
Hsu et al.

(10) Patent No.: US 10,164,052 B2
(45) Date of Patent: Dec. 25, 2018

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chia-Fu Hsu, Tainan (TW); Chun-Mao Chiou, Chiayi County (TW); Shih-Chieh Hsu, New Taipei (TW); Lung-En Kuo, Tainan (TW); You-Di Jhang, New Taipei (TW); Jian-Cun Ke, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/667,629

(22) Filed: Aug. 3, 2017

(65) Prior Publication Data

US 2017/0330954 A1 Nov. 16, 2017

Related U.S. Application Data

(63) Continuation of application No. 14/324,092, filed on Jul. 4, 2014, now Pat. No. 9,761,690.

(30) Foreign Application Priority Data

Jun. 9, 2014 (TW) .............................. 103119927 A

(51) Int. Cl.
H01L 29/49 (2006.01)
H01L 29/51 (2006.01)
H01L 29/66 (2006.01)
H01L 29/40 (2006.01)
H01L 29/78 (2006.01)

(52) U.S. Cl.
CPC ........ *H01L 29/6656* (2013.01); *H01L 29/401* (2013.01); *H01L 29/4966* (2013.01); *H01L 29/511* (2013.01); *H01L 29/513* (2013.01); *H01L 29/517* (2013.01);

(Continued)

(58) Field of Classification Search
None
See application file for complete search history.

(56) References Cited

U.S. PATENT DOCUMENTS 6,555,879 B1 * 4/2003 Krivokapic ....... H01L 21/28194
257/347
8,772,148 B1 * 7/2014 Wang .................... H01L 29/772
257/288

(Continued)

*Primary Examiner* — Erik T. K. Peterson
(74) *Attorney, Agent, or Firm* — Winston Hsu

(57) ABSTRACT

A semiconductor device includes an interfacial layer on a substrate and agate structure on the interfacial layer. Preferably, the gate structure includes a patterned high-k dielectric layer, the patterned high-k dielectric layer comprises a metal oxide layer, and a horizontal direction width of the patterned high-k dielectric layer and a horizontal direction width of the interfacial layer are different. The semiconductor device also includes a first spacer adjacent to the gate structure and on part of the interfacial layer and contacting a top surface of the interfacial layer and a second spacer on the sidewalls of the first spacer and the interfacial layer. Preferably, a planar bottom surface of the second spacer is lower than a planar bottom surface of the first spacer and extending along a same direction as the planar bottom surface of the first spacer.

9 Claims, 3 Drawing Sheets

(52) U.S. Cl.
CPC ...... *H01L 29/518* (2013.01); *H01L 29/66545* (2013.01); *H01L 29/7833* (2013.01)

(56) References Cited

U.S. PATENT DOCUMENTS

| | | | |
|---|---|---|---|
| 2002/0047170 A1 | 4/2002 | Ota | |
| 2004/0023478 A1* | 2/2004 | Samavedam | ... H01L 21/823814 |
| | | | 438/592 |
| 2005/0081781 A1 | 4/2005 | Lin et al. | |
| 2005/0093084 A1* | 5/2005 | Wang | ................ H01L 21/28194 |
| | | | 257/410 |
| 2006/0284271 A1 | 12/2006 | Doyle | |
| 2007/0200185 A1* | 8/2007 | Hirase | ................ H01L 29/4983 |
| | | | 257/410 |
| 2007/0272975 A1 | 11/2007 | Schaeffer | |
| 2008/0135951 A1 | 6/2008 | Kaushik | |
| 2010/0044783 A1 | 2/2010 | Chuang | |
| 2010/0062591 A1 | 3/2010 | Lin | |
| 2010/0181620 A1 | 7/2010 | Booth | |
| 2011/0298053 A1 | 12/2011 | Zhong | |
| 2012/0018816 A1* | 1/2012 | Sen | ................... H01L 21/28097 |
| | | | 257/410 |
| 2012/0256274 A1 | 10/2012 | Riess | |
| 2012/0305995 A1* | 12/2012 | Javorka | ............... H01L 29/1054 |
| | | | 257/288 |
| 2013/0075826 A1 | 3/2013 | Xu | |
| 2013/0130460 A1 | 5/2013 | Liao | |
| 2014/0110791 A1 | 4/2014 | Clark | |
| 2014/0124874 A1* | 5/2014 | Mehrotra | .......... H01L 21/28114 |
| | | | 257/410 |
| 2015/0179748 A1 | 6/2015 | Chang | |

* cited by examiner

SEMICONDUCTOR DEVICE AND METHOD FOR FABRICATING THE SAME

CROSS REFERENCE TO RELATED APPLICATIONS

This is a continuation application of U.S. patent application Ser. No. 14/324,092, filed on Jul. 4, 2014, and all benefits of such earlier application are hereby claimed for this new continuation application.

BACKGROUND OF THE INVENTION

1. Field of the Invention

The invention relates to a method for fabricating semiconductor device, and more particularly, to a method of retaining interfacial layer while a stacked structure is patterned to form gate structure.

2. Description of the Prior Art

In current semiconductor industry, polysilicon has been widely used as a gap-filling material for fabricating gate electrode of metal-oxide-semiconductor (MOS) transistors. However, the conventional polysilicon gate also faced problems such as inferior performance due to boron penetration and unavoidable depletion effect which increases equivalent thickness of gate dielectric layer, reduces gate capacitance, and worsens driving force of the devices. In replacing polysilicon gates, work function metals have been developed to serve as a control electrode working in conjunction with high-K gate dielectric layers.

However, in current fabrication of high-k metal transistor, particularly during the stage when spacer is formed on the sidewall of gate structure, issues such as over-etching or undercut often arise and causing etching gas to etch through spacer until reaching the bottom of the gate structure. This induces erosion in high-k dielectric layer and/or bottom barrier metal (BBM) and affects the performance of the device substantially. Hence, how to resolve this issue has become an important task in this field.

SUMMARY OF THE INVENTION

According to an embodiment of the present invention, a semiconductor device includes an interfacial layer on a substrate and a gate structure on the interfacial layer. Preferably, the gate structure includes a patterned high-k dielectric layer, the patterned high-k dielectric layer comprises a metal oxide layer, and a horizontal direction width of the patterned high-k dielectric layer and a horizontal direction width of the interfacial layer are different. The semiconductor device also includes a first spacer adjacent to the gate structure and on part of the interfacial layer and contacting a top surface of the interfacial layer and a second spacer on the sidewalls of the first spacer and the interfacial layer. Preferably, a planar bottom surface of the second spacer is lower than a planar bottom surface of the first spacer and extending along a same direction as the planar bottom surface of the first spacer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
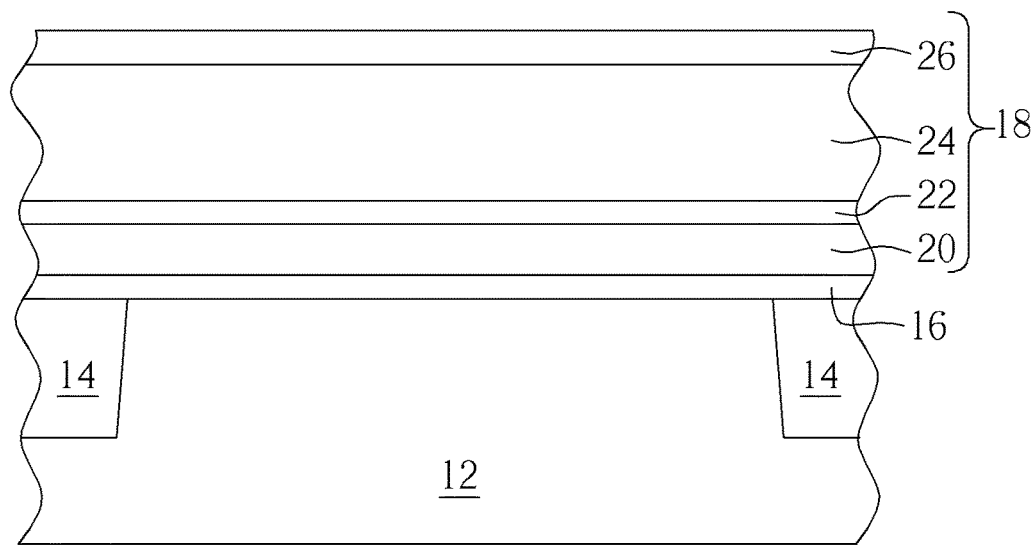
FIGS. 1-5 illustrate a method for fabricating semiconductor device according to a preferred embodiment of the present invention.

Referring to FIGS. 1-5, FIGS. 1-5 illustrate a method for fabricating semiconductor device according to a preferred embodiment of the present invention. As shown in FIG. 1, a substrate 12, such as a wafer or silicon-on-insulator (SOI) substrate is provided, in which a plurality of shallow trench isolations (STIs) 14 are formed in the substrate 12. An interfacial layer 16 is then deposited on the substrate 12 and the STI 14, and a stack structure 18 is formed on the substrate 12 thereafter. The formation of the stack structure 18 is accomplished by sequentially forming a high-k dielectric layer 20, a bottom barrier metal (BBM) layer 22, a silicon layer 24, and a hard mask 26 on the interfacial layer 16.

In this embodiment, the interfacial layer 16 is preferably composed of silicon material such as silicon dioxide ($SiO_2$), silicon nitride (SiN), or silicon oxynitride (SiON), or other dielectric material with high permittivity or dielectric constant. The silicon layer 24 is preferably composed of single crystal silicon, doped polysilicon, or amorphous polysilicon, and the hard mask 16 could be selected from the group consisting of SiC, SiON, SiN, SiCN and SiBN, but not limited thereto. Despite the hard mask 26 in this embodiment is preferably a single-layered hard mask, a composite hard mask composed of both silicon nitride layer and silicon oxide layer could also be utilized according to the demand of the process, which is also within the scope of the present invention.

As the present embodiment pertains to a high-k first process from gate last process, the high-k dielectric layer 20 preferably has a "I-shaped" cross section and preferably be selected from dielectric materials having dielectric constant (k value) larger than 4. For instance, the high-k dielectric layer 20 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the high-k dielectric layer 20 may be formed by atomic layer deposition (ALD) process or metal-organic chemical vapor deposition (MOCVD) process, but not limited thereto.

Figure 2:
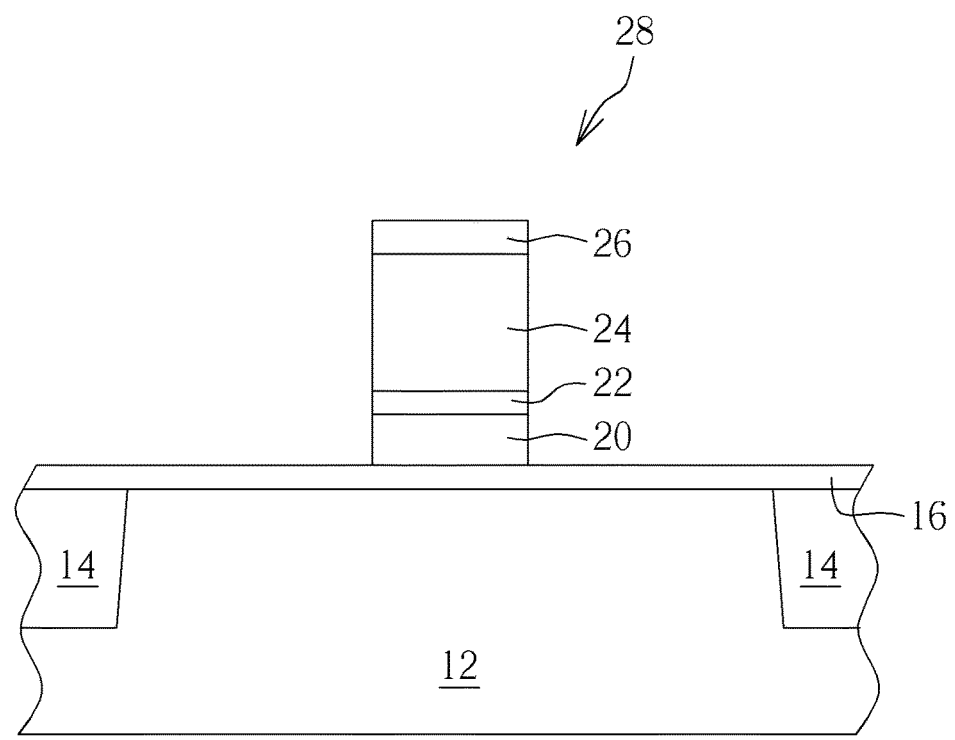

Next, as shown in FIG. 2, a patterned mask, such as a patterned resist (not shown) is formed on the hard mask 26, and a pattern transfer process is conducted by using the patterned resist as mask to partially remove the hard mask 26, silicon layer 24, BBM layer 22, and high-k dielectric layer 20 not covered by the patterned resist through single or multiple etching processes for forming a gate structure 28. In other words, the gate structure 28 preferably composed of a patterned high-k dielectric layer 20, a patterned BBM layer 22, a patterned silicon layer 24, and a patterned hard mask 26.

Figure 3:
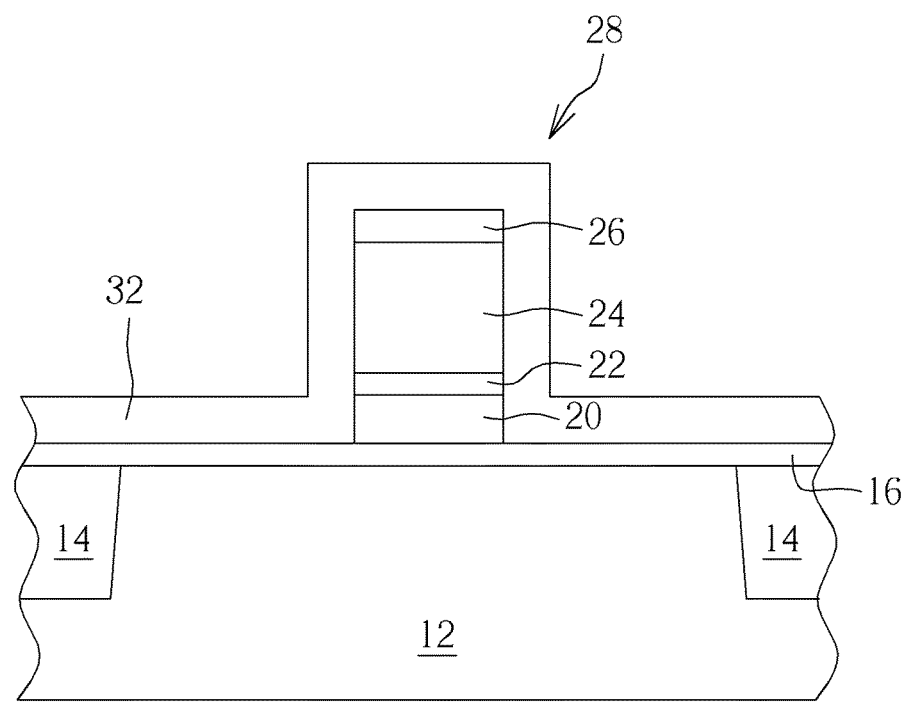

Next, as shown in FIG. 3, a spacer formation is conducted by first forming a liner 32 on the interfacial layer 16 and the gate structure 28. The liner 32 is preferably composed of silicon dioxide or silicon nitride, but not limited thereto.

Figure 4:
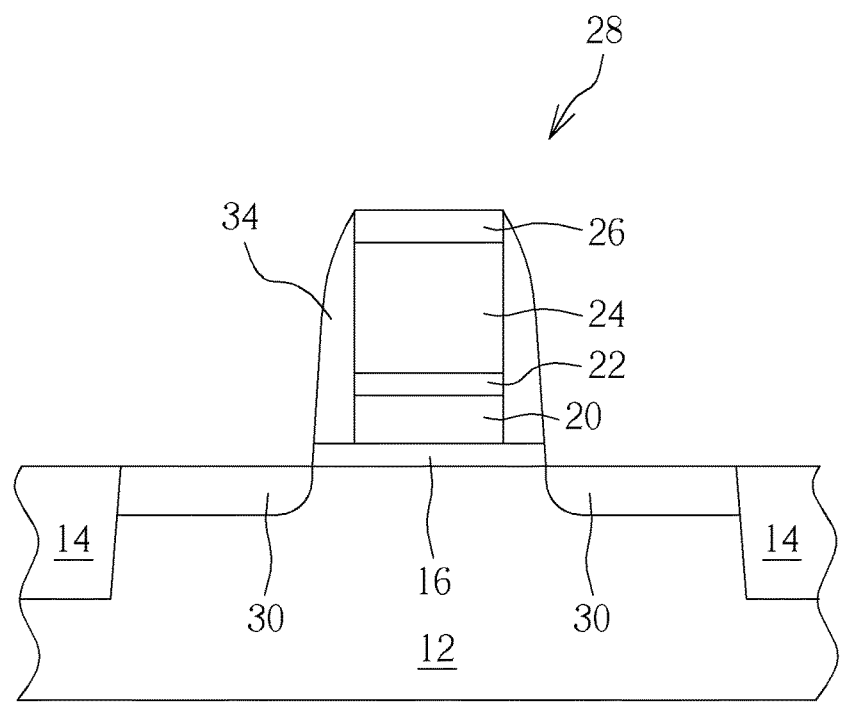

As shown in FIG. 4, an etching back process is then conducted by using single or multiple etching processes to remove part of the liner 32 and part of interfacial layer 16 for forming a spacer 34 on the sidewall of the gate structure 28. According to a preferred embodiment of the present invention, the spacer 34 preferably sits on the remaining interfacial layer 16 and as part of the interfacial layer 16 is removed with the liner 32 in the aforementioned etching back process, an edge of the spacer 34 is aligned with an edge of the interfacial layer 16. This completes the fabrication of a semiconductor device according to a preferred embodiment of the present invention. Next, a light ion implantation process could be conducted to form a lightly doped drain (LDD) 30 in the substrate 12 adjacent to two sides of the spacer 34. The ions implanted during the light ion implantation process could be adjusted depending on the type of the transistor. being fabricated For instance, if a NMOS transistor were to be fabricated, n-type dopants could be implanted into the substrate where as if a PMOS transistor were to be fabricated, p-type dopants could be implanted into the substrate. It should be noted that despite the LDD 30 is formed in the substrate 12 after the fabrication of spacer 34 is completed, the LDD 30 could also be formed before the spacer 34 is fabricated, which is also within the scope of the present invention.

Referring again to FIG. 4, which illustrates a semiconductor device structure according to an embodiment of the present invention. The semiconductor device preferably includes a substrate 12, an interfacial layer 16 on the substrate 12, a gate structure 28 on the interfacial layer 16, and a spacer 34 adjacent to the gate structure 28 and on part of the interfacial layer 16. As shown in the figure, the gate structure 28 includes a patterned high-k dielectric layer 20, a patterned BBM layer 22 on the high-k dielectric layer 20, a patterned silicon layer 24 on the patterned BBM layer 22, and a patterned hard mask 26 on the patterned silicon layer 24.

Preferably, the interfacial layer 16 is composed of silicon dioxide, the patterned BBM layer 22 is composed of TiN, the patterned silicon layer 24 is composed of polysilicon or amorphous silicon, and the spacer 34 is composed of silicon oxide or silicon nitride. Regarding the position of the interfacial layer 16 relative to the entire gate structure 28, the width of the interfacial layer 16 is preferably wider than the overall width of the gate structure 28, and an edge of the interfacial layer 16 is aligned with an edge of the spacer 34.

Figure 5:
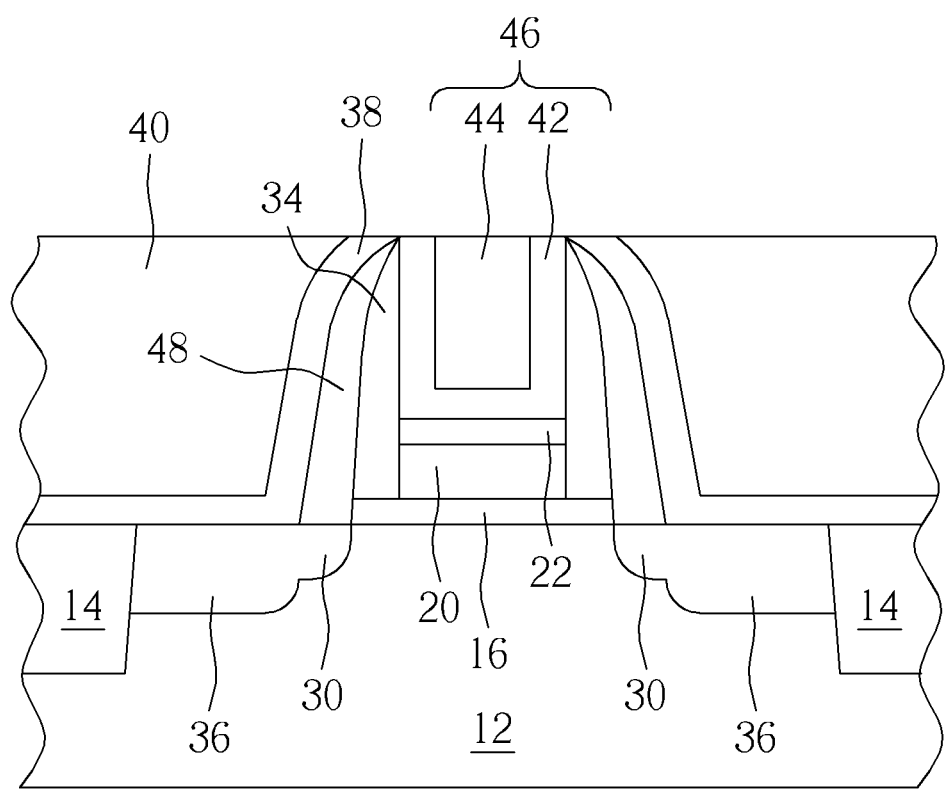

After the spacer 34 is fabricated, as shown in FIG. 5, typical transistor fabrication process could be carried out by forming a main spacer 48 on the sidewall of the spacer 34, and then forming a source/drain region 36 in the substrate 12 adjacent to two sides of the main spacer 48. Next, a contact etch stop layer (CESL) 38 could be formed on the gate structure 28, and an interlayer dielectric (ILD) layer 40 could be formed on the CESL 38. It should be noted that elements such as epitaxial layer and silicides could also be formed before the CESL 38, and as the formation of these elements are well known to those skilled in the art, the details of which are not explained herein for the sake of brevity.

Next, a replacement metal gate (RMG) process could be conducted to transform the gate structure 28 into a metal gate. The RMG process could be accomplished by performing a selective dry etching or wet etching process, such as using etchants including ammonium hydroxide ($NH_4OH$) or tetramethylammonium hydroxide (TMAH) to remove the silicon layer 24 in the gate structure 28 for forming a recess (not shown). Next, a conductive layer 46 including a U-shaped work function metal layer 42 and low resistance metal layer 44 is deposited into the recess, and another planarizing process is conducted thereafter to form a metal gate.

In this embodiment, the work function metal layer 42 is formed for tuning the work function of the metal gate so that the device could be adapted in an NMOS or a PMOS transistor. For an NMOS transistor, the work function metal layer 42 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but is not limited thereto. For a PMOS transistor, the work function metal layer 42 having a work function ranging between 4.8 eV and 5.2 eV may include titanium nitride (TiN), tantalum nitride (TaN), tantalum carbide (TaC), but is not limited thereto. A barrier layer (not shown) could be formed between the work function metal layer 42 and the low resistance metal layer 44, in which the material of the barrier layer may include titanium (Ti), titanium nitride (TiN), tantalum (Ta) or tantalum nitride (TaN). Furthermore, the material of the low resistance metal layer 44 may include copper (Cu), aluminum (Al), tungsten (W), titanium aluminum (TiAl), cobalt tungsten phosphide (CoWP) or any combination thereof.

Overall, the present invention utilizes an etching process to only remove part of the hard mask, silicon layer, BBM layer, and high-k dielectric layer while leaving the interfacial layer intact during the process for patterning a stack structure into a gate structure. By following this approach, the spacer formed thereafter would be sitting on part of the interfacial layer and as the width of the interfacial layer becomes wider than the overall width of the gate structure, the extended portion of the interfacial layer could be used to increase the structural strength of the bottom portion of the gate structure. Ultimately, the high-k dielectric layer and/or BBM layer situating in the bottom of the gate structure are protected from the etching gas used during the spacer formation process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   an interfacial layer on a substrate;
   a gate structure on the interfacial layer, wherein the gate structure comprises a patterned high-k dielectric layer, the patterned high-k dielectric layer comprises a metal oxide layer, and a horizontal direction width of the patterned high-k dielectric layer and a horizontal direction width of the interfacial layer are different, wherein the horizontal direction width of the patterned high-k dielectric layer is taken in a horizontal direction from the substrate;
   a first spacer adjacent to the gate structure and on part of the interfacial layer and contacting a top surface of the interfacial layer; and
   a second spacer on the sidewalls of the first spacer and the interfacial layer, wherein a planar bottom surface of the second spacer is lower than a planar bottom surface of the first spacer and extending along a same direction as the planar bottom surface of the first spacer and a tip of the first spacer, a tip of the second spacer, and a top surface of the gate structure are coplanar.

2. The semiconductor device of claim 1, wherein the interfacial layer comprises silicon dioxide.

3. The semiconductor device of claim 1, wherein the gate structure comprises the patterned high-k dielectric layer, a patterned bottom barrier metal (BBM) layer on the patterned high-k dielectric layer, a patterned silicon layer on the patterned BBM layer, and a patterned hard mask on the patterned silicon layer.

4. The semiconductor device of claim 3, wherein the patterned BBM layer comprises TiN.

5. The semiconductor device of claim 3, wherein the patterned silicon layer comprises amorphous silicon or polysilicon.

6. The semiconductor device of claim 1, wherein the first spacer comprises silicon dioxide or silicon nitride.

7. The semiconductor device of claim 1, wherein the horizontal direction width of the interfacial layer is wider than a horizontal direction width of the gate structure.

8. The semiconductor device of claim 1, wherein an edge of the interfacial layer is aligned with an edge of the first spacer.

9. The semiconductor device of claim 1, further comprising a contact etch stop layer (CESL) around the second spacer, wherein a bottom surface of the CESL is lower than the planar bottom surface of the first spacer.

* * * * *